(12) United States Patent
Philip et al.

(10) Patent No.: US 12,402,546 B2
(45) Date of Patent: Aug. 26, 2025

(54) COMPOSITE MATERIAL PHASE CHANGE MEMORY CELL

(71) Applicant: International Business Machines Corporation, Armonk, NY (US)

(72) Inventors: Timothy Mathew Philip, Albany, NY (US); Kevin W. Brew, Niskayuna, NY (US); Caitlin Camille Stuckey, Albany, NY (US); Rebecca Colby Martin, Greenfield Center, NY (US); Robert Robison, Rexford, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 727 days.

(21) Appl. No.: 17/646,210

(22) Filed: Dec. 28, 2021

(65) Prior Publication Data

US 2023/0210026 A1    Jun. 29, 2023

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/00* (2023.02); *H10N 70/021* (2023.02); *H10N 70/8613* (2023.02)

(58) Field of Classification Search
CPC .............. H10N 70/231; H10N 70/021; H10N 70/8613; H10N 70/066; H10N 70/8413; H10N 70/8828; H10B 63/00
See application file for complete search history.

(56) References Cited

U.S. PATENT DOCUMENTS 7,859,893 B2 *  12/2010  Liu .................... H10N 70/823
                                                         977/754
7,973,384 B2 *   7/2011  Happ ................ H10N 70/8828
                                                         257/536

(Continued)

FOREIGN PATENT DOCUMENTS

WO      2010097302 A1    9/2010

OTHER PUBLICATIONS

Brew et al., "Phase Change Memory Cell Sidewall Projection Liner," U.S. Appl. No. 17/489,602, filed Sep. 29, 2021.

(Continued)

*Primary Examiner* — Allison Bernstein
(74) *Attorney, Agent, or Firm* — Kimberly Zillig

(57) ABSTRACT

A phase change memory (PCM) cell includes a first electrode comprised of a first electrically conductive material, a second electrode comprised of a second electrically conductive material, and a phase change section positioned between the first electrode and the second electrode. The phase change section includes a first phase change material having a first resistance drift coefficient, and a second phase change material having a second resistance drift coefficient that is greater than the first resistance drift coefficient. An axis of the PCM cell extends between the first electrode and the second electrode, and the second phase change material is offset from the first phase change material in a direction that is perpendicular to the axis.

19 Claims, 8 Drawing Sheets

(56) References Cited

U.S. PATENT DOCUMENTS

| | | | |
|---|---|---|---|
| 8,124,950 B2* | 2/2012 | Happ | H10N 70/023 |
| | | | 257/3 |
| 8,164,949 B2 | 4/2012 | Savransky | |
| 8,237,145 B2* | 8/2012 | Kamata | H10N 70/826 |
| | | | 977/734 |
| 9,257,639 B2 | 2/2016 | Kim | |
| 9,558,823 B1 | 1/2017 | Khwa | |
| 9,882,126 B2* | 1/2018 | BrightSky | H10N 70/884 |
| 10,991,879 B2 | 4/2021 | Ruiz | |
| 11,456,417 B2* | 9/2022 | Brew | H10N 70/826 |
| 2020/0381618 A1 | 12/2020 | Cappelletti | |
| 2021/0257547 A1* | 8/2021 | Shen | H10N 70/826 |

OTHER PUBLICATIONS

Ding et al., "Phase-change heterostructure enables ultralow noise and drift for memory operation," Science, vol. 366, Oct. 11, 2019, pp. 210-215, DOI: 10.1126/science.aay0291.

Kersting et al., "State dependence and temporal evolution of resistance in projected phase change memory," Scientific Reports, vol. 10, Article No. 8248, May 19, 2020, 11 pages. <https://www.ncbi.nlm.nih.gov/pmc/articles/PMC7237438/pdf/41598_2020_Article_64826.pdf>.

Shen et al., "Phase Change Memory Using Multiple Stacks of PCM Materials," U.S. Appl. No. 16/789,502, filed Feb. 13, 2020.

Simpson et al., "Interfacial phase-change memory," Nature Nanotechnology, vol. 6, Aug. 2011, pp. 501-505, DOI: 10.1038/nnano.2011.96.

* cited by examiner

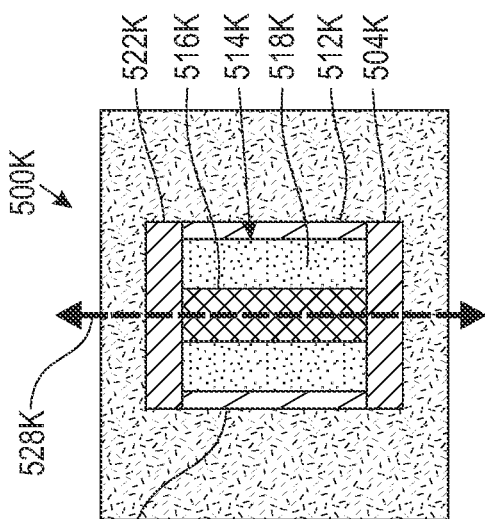
FIG. 9
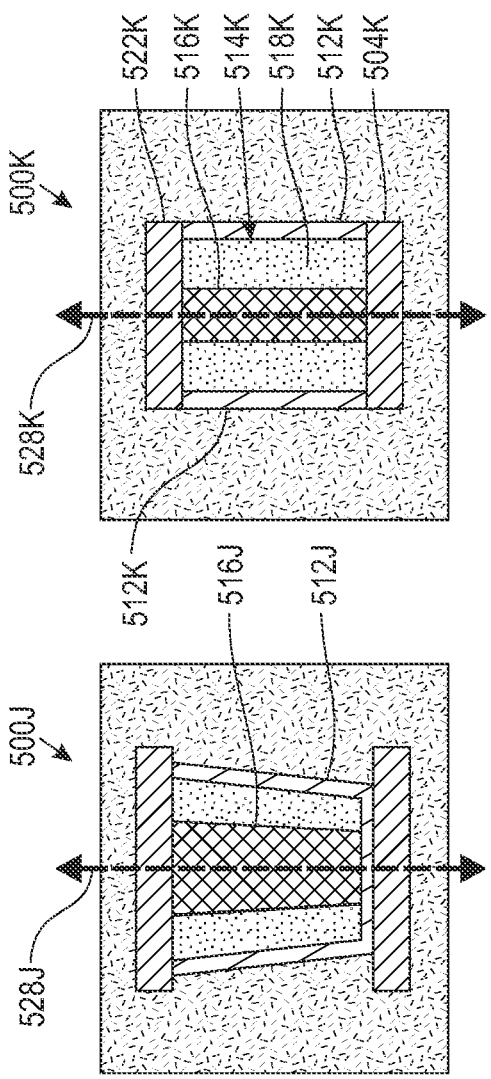
FIG. 8B
FIG. 8A
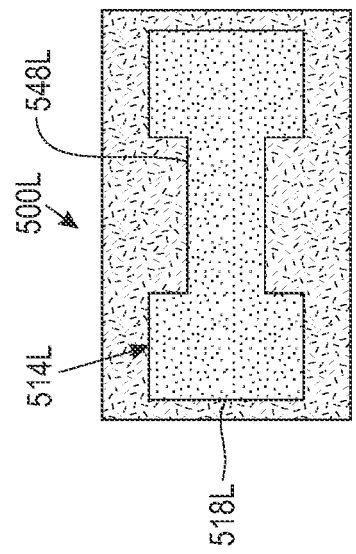
FIG. 10B
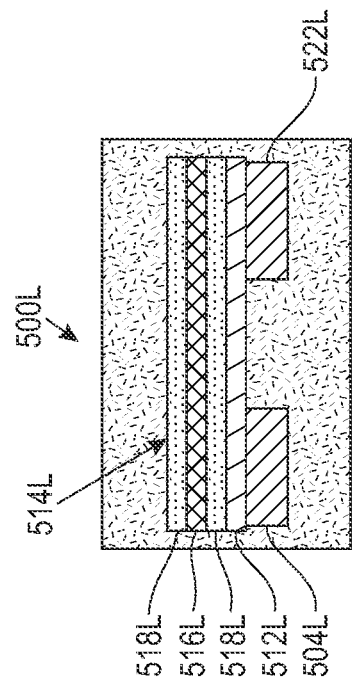
FIG. 10A

COMPOSITE MATERIAL PHASE CHANGE MEMORY CELL

BACKGROUND

The present invention relates to computer memory, and more specifically, to phase change material memory devices with composite phase change materials.

Phase change memory (PCM) can be utilized for both training and inference in analog computing for artificial intelligence. The PCM structures can include phase change memristive devices with tunable conductivities and overall high device resistance with high retention to minimize energy consumption. The tuning can be accomplished by forming different structural states with varying proportions of crystalline and amorphous phases of PCM material. However, PCM materials can suffer from resistance drift over time, which can negatively affect the fidelity of the tuning.

SUMMARY

According to an embodiment of the present disclosure, a PCM cell includes a first electrode comprised of a first electrically conductive material, a second electrode comprised of a second electrically conductive material, and a phase change section positioned between the first electrode and the second electrode. The phase change section includes a first phase change material having a first resistance drift coefficient, and a second phase change material having a second resistance drift coefficient that is greater than the first resistance drift coefficient. An axis of the PCM cell extends between the first electrode and the second electrode, and the second phase change material is offset from the first phase change material in a direction that is perpendicular to the axis.

According to an embodiment of the present disclosure, a method of manufacturing a PCM cell includes forming a first electrode, forming a phase change section electrically connected to the first electrode, and forming a second electrode on the phase change section. The phase change section includes a first phase change material having a first resistance drift coefficient, and a second phase change material having a second resistance drift coefficient that is greater than the first resistance drift coefficient.

According to an embodiment of the present disclosure, a PCM cell includes a first electrode comprised of a first electrically conductive material, a second electrode comprised of a second electrically conductive material, and a phase change section positioned between the first electrode and the second electrode. The phase change section includes a first phase change material having a first resistivity, and a second phase change material having a second resistivity that is greater than the first resistivity. An axis of the PCM cell extends between the first electrode and the second electrode, and the second phase change material is offset from the first phase change material in a direction that is perpendicular to the axis.

BRIEF DESCRIPTION OF THE DRAWINGS

FIGS. 8A and 8B are cross-section views of alternate embodiment confined PCM cells, in accordance with embodiments of the present disclosure.

FIG. 9 is a cross-section view of alternate embodiment pillar PCM cell, in accordance with embodiments of the present disclosure.

FIG. 10A is a cross-section view of an alternate embodiment bridge PCM cell, in accordance with embodiments of the present disclosure.

FIG. 10B is a top view of bridge PCM cell of FIG. 10A, in accordance with embodiments of the present disclosure.

DETAILED DESCRIPTION

Figure 1A:
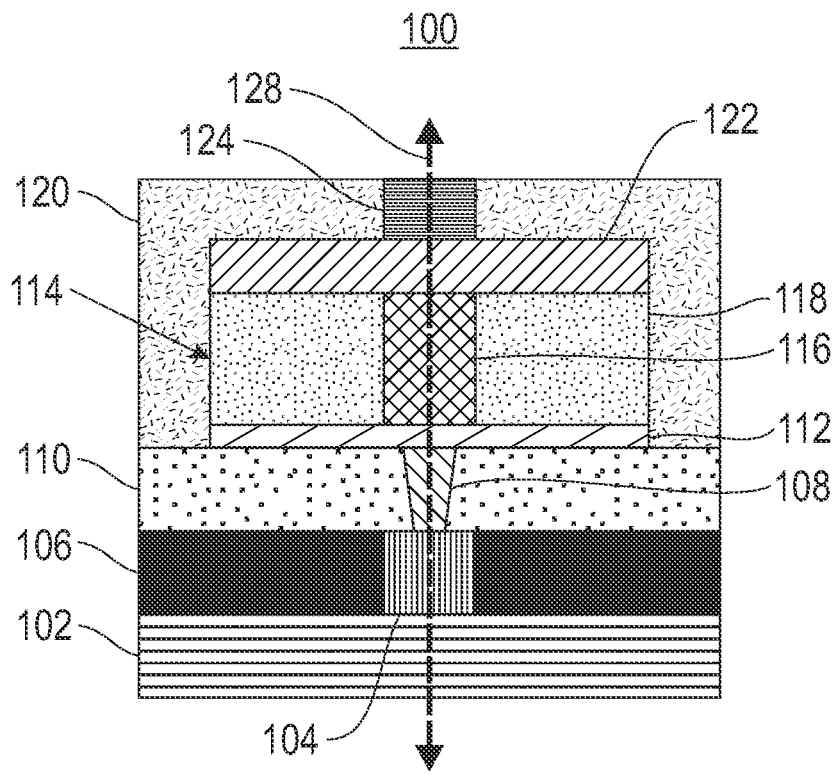
FIG. 1A is a cross-section view of a mushroom PCM cell with a composite phase change section in a polycrystalline configuration, in accordance with embodiments of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Figure 1B:
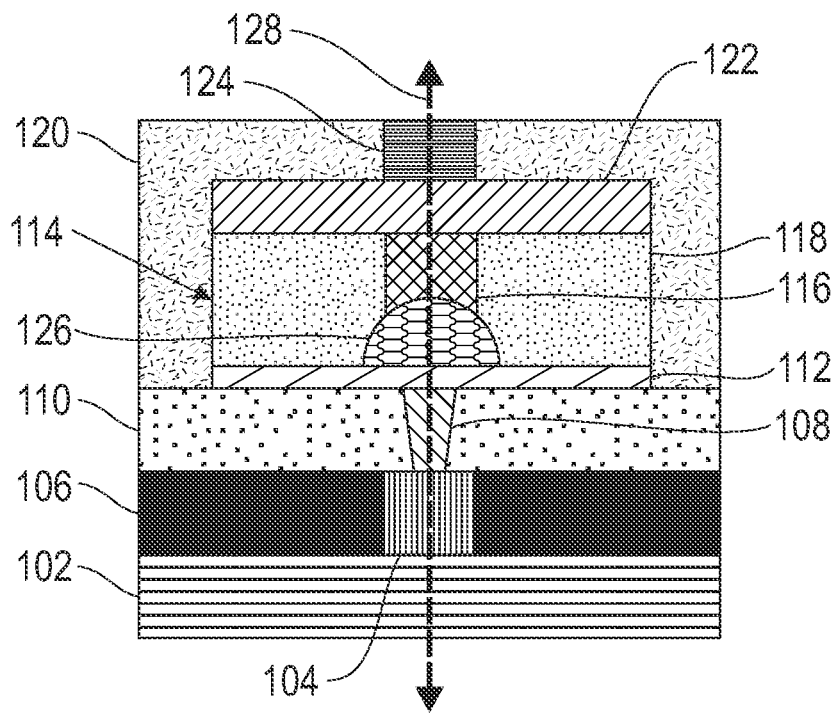
FIG. 1B is a cross-section view of the mushroom PCM cell with the composite phase change section including an amorphous zone, in accordance with embodiments of the present disclosure.

FIGS. 1A and 1B are cross-section views of PCM cell 100 for use in, for example, an integrated circuit (not shown). In the illustrated embodiment, PCM cell 100 comprises bottom wire 102, bottom electrode 104, insulator 106, heater 108, insulator 110, projection liner (PL) 112, PCM section 114 (which includes a first, undoped material 116 and a second, doped material 118), insulator 120, top electrode 122, and top wire 124.

In the illustrated embodiment, the bottom of bottom electrode 104 is in direct contact with and electrically connected to the top of bottom wire 102, which can receive electrical signals from other components (not shown) of the integrated circuit. The bottom of heater 108 is in direct contact with and electrically connected to the top of bottom electrode 104. The bottom of PL 112 is in direct contact with and electrically and thermally connected to the top of heater 108. The bottom of PCM section 114 is in direct contact with and electrically and thermally connected to the top of PL 112. The bottom of top electrode 122 is in direct contact with and electrically connected to the top of PCM section 114. The bottom of top wire 124 is in direct contact with and electrically connected to the top of top electrode 122, and top wire 124 can deliver electrical signals from PCM cell 100 to other components (not shown) of the integrated circuit.

In the illustrated embodiment, insulators 106, 110, 120 structurally support and electrically isolate the other components of PCM cell 100, selectively, and fill in the space therebetween, as appropriate. Thus, the outer side of bottom electrode 104 is in direct contact with and laterally surrounded by insulator 106, and the outer side of heater 108 is in direct contact with and laterally surrounded by insulator 110. Furthermore, the bottom side of PL 112 is in direct contact with and axially adjacent to insulator 110, and top wire 124 are in direct contact with and laterally surrounded by insulator 120, and top electrode 122 is in direct contact with and laterally and axially adjacent to insulator 120.

In the illustrated embodiment, a cross-section of PCM cell 100 (into the page in FIG. 1) can be circular, although in other embodiments, it can be rectangular, square, oval, or any other suitable shape. In addition, the widths of PCM section 114, PL 112, and top electrode 122 are the same, whereas the width of heater 108 is substantially reduced, comparatively (e.g., three to seven times smaller, or about five times smaller). Thereby, PCM cell 100 can be said to have a mushroom configuration wherein an electrical signal (i.e., electrical current) can flow from bottom electrode 104 to top electrode 122 through heater 108, PL 112, and PCM section 114. In some embodiments, the width of heater 108 is between 35 and 40 nanometers (nm), and the widths of PL 112, PCM section 114, and top electrode 122 are between 100 nm and 400 nm. PCM section 114 has a height of about 80 nm, and the width of undoped material 116 within PCM section 114 is between 30 nm and 60 nm. Thus, in some embodiments, the width of doped material 118 can be one-and-a-half to fourteen times larger than undoped material 116, and in some embodiments, the width of doped material 118 can be three to seven times larger than undoped material 116. Furthermore, in some embodiments, the width of undoped material 116 can be three-quarters to twice the size of heater 108.

In the illustrated embodiment, heater 108 and undoped material 116 are positioned centrally along axis 128 of PCM cell 100 that extends between bottom electrode 104 and top electrode 122 (which is parallel to the direction of current flow in PCM cell 100 during operation). As depicted, axis 128 may extend longitudinally through PCM cell 100 such that axis 128 extends through each of top wire 124, top electrode 122, undoped material 116, heater 108, bottom electrode 104, and bottom wire 102. In some embodiments, PCM cell 100 may be mirrored in at least some directions across axis 128. Doped material 118 surrounds undoped material 116, and doped material 118 is offset from axis 128 in a lateral direction (i.e., perpendicular to axis 128). Thereby, undoped material 116 is positioned closer to heater 108 than doped material 118 is.

In the illustrated embodiment, bottom electrode 104 and top electrode 122 are comprised of a very electrically conductive material, such as metal or metallic compound, for example, titanium nitride (TiN) or tungsten (W). Heater 108 is an electrode that is comprised of TiN or a higher resistance metal, such as, for example, titanium tungsten (TiW), tantalum nitride (TaN), or titanium aluminide (TiAl), and has a relatively narrow cross-sectional area, which focuses electrical current that is run through PCM cell 100. This allows heater 108 to generate heat through resistive heating during a pulse of electricity, which can be used to selectively change the temperature of PCM section 114, for example, above the crystallization temperature and the melting temperature of undoped material 116 and doped material 118. In addition, heater 108 can be comprised of multiple different electrically conductive materials that can be arranged in multiple layers.

In the illustrated embodiment, insulators 106, 110, 120 are comprised of a dielectric (electrical insulating) material, such as, for example, silicon nitride (SiN), silicon oxide ($SiO_2$), silicon nitride carbide (SiNC), or tetraethyl orthosilicate (TEOS). In some embodiments, all of the insulators 106, 110, 120 are the same material, and in other embodiments, different materials are used for some or all of insulators 106, 110, 120. In addition, PL 112 is comprised of a moderately electrically resistive material, such as a metal and/or semiconductor (e.g., TaN; tungsten nitride (WN); amorphous carbons (a-C); doped a-C; transparent conductive oxides such as tin-doped indium oxide (ITO), aluminum zirconium oxide (AZO), and high-resistance metal chalcogenides (ex. titanium selenide (TiSe)), and other poorly conducting metal nitrides). The material comprising PL 112 have a higher electrical resistivity than polycrystalline phases of undoped material 116 and doped material 118 but lower electrical resistivity than amorphous phases undoped material 116 and doped material 118.

In the illustrated embodiment, undoped material 116 is composed essentially of a phase change material such as a germanium-antimony-tellurium (GST), gallium-antimony-tellurium (GaST), or silver-iridium-antimony-telluride (AIST) material, although other materials can be used as appropriate. Examples of other PCM materials can include, but are not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. The terms "composed essentially" and "consist essentially," as used herein with respect to materials of different layers, indicates that other materials, if present, do not materially alter the basic characteristics of the recited materials. For example, an undoped material 116 consisting essentially of GST material does not include other materials that materially alter the basic characteristics of the GST material.

On the other hand, doped material 118 can be a mixture of a phase change material (e.g., similar to or the same as undoped material 116) and a phase separated dopant material such as, for example, one or more dielectric materials and/or poorly-electrically conductive materials (e.g., oxygen (O), nitrogen (N), carbon (C), SiO2, SiO, SiON, SiOC, tantalum nitride (Ta3N5), aluminum nitride (AlN), and titanium nitride (TiN)). The grains of the phase separated dopant material can restrict the grain size of the phase change material and provide "nano opens" (i.e., local regions of relatively high electrical resistance) to increase the resistance of doped material 118, and, in some embodiments, the amount of the phase separated dopant material doped material 118 is at least 10% by volume. Doped material 118 can also be a substitutional or interstitial doped phase change material such as, for example, titanium-GST (TiGST), gallium-GST (GaGST), silicon-GST (SiGST), or bismuth-GST (BiGST), since these atoms can substitute/sit on interstices due to their solubility in GST.

In the illustrated embodiment, PCM cell 100 can be operated as a memory cell by passing an electrical current pulse from bottom electrode 104 to top electrode 122 to program PCM cell 100. This can be done at a variety of voltages and/or for a variety of durations to read or write a value on PCM cell 100. For example, to write, a high voltage can be used (e.g., 1 volt (V) to 4 V) for a short duration, which can cause heater 108 to locally heat PCM section 114 beyond the melting points of undoped material 116 and doped material 118. Once the flow of current ceases, PCM section 114 can cool down rapidly, which forms amorphous zone 126 in a process called "resetting". Zone 126 is a dome-shaped region of PCM section 114 having an amorphous configuration (in both undoped material 116 and doped material 118), although the remainder of PCM section 114 is still in a polycrystalline configuration. In general, this amorphous configuration has no definite structure. However, there can be local, disjoint crystalline nuclei (i.e., small, crystallized regions of phase change section 114) present in zone 126. The creation of zone 126 can cause the electrical resistance across PCM cell 100 to increase as compared to a solely polycrystalline configuration (a la PCM cell 100 in FIG. 1A). These resistance values of PCM cell 100 can be read without changing the phase of PCM section 114 (including that of zone 126) or the resistance value of PCM cell 100, for example, by sending a current pulse at a low voltage (e.g., 0.2 V) from bottom electrode 104 to top electrode 122.

In addition, PCM section 114 can be rewritten and returned back to a solely polycrystalline configuration by "setting" PCM cell 100. One way to rewrite PCM section 114 uses a high voltage electrical pulse (e.g., 1 V to 4 V) for a short period of time (e.g., 10 nanoseconds (ns)), which can cause PCM section 114 to heat up beyond the crystallization points of undoped material 116 and doped material 118 but not to their melting points. Since the crystallization temperature is lower than the melting temperature, once the flow of current ceases, PCM section 114 can anneal and form crystals. Another way to rewrite PCM section 114 uses an electrical pulse with a relatively long trailing edge (e.g., 1 microsecond) (as opposed to a square pulse with a relatively short trailing edge on the order of nanoseconds) that is strong enough to heat PCM section 114 beyond the melting points of undoped material 116 and doped material 118, after which, PCM section 114 is cooled down slowly, allowing crystals to form. Either of these processes cause the electrical resistance across PCM cell 100 to decrease as compared to having an amorphous zone 126. This new resistance value can then be read using current at a low voltage (e.g., 0.2 V) without changing the phase of PCM section 114 or the resistance value of PCM cell 100.

In some embodiments, the melting temperatures of undoped material 116 and doped material 118 can be around 600° C. In some embodiments, the crystallization temperatures of undoped material 116 and doped material 118 can be around 180° C. In addition, the process of setting and resetting PCM cell 100 can occur repeatedly, and in some embodiments, different zones 126 with different resistances can be created in PCM materials 114 (e.g., due to having different sizes of zone 126 and/or amounts of crystallization nuclei in zone 126). This allows for PCM cell 100 to have various distinct resistances that can be created by varying the resetting parameters. Thereby, if PCM cell 100 is considered to represent information digits, these digits can be non-binary (as opposed to traditional bits). However, in some embodiments, PCM cell 100 can be used as a bit by either having or not having a uniform zone 126 in PCM section 114. In such embodiments, PCM cells 100 can have a high resistance (a.k.a., low voltage output or "0") or low resistance (a.k.a., high voltage output or "1").

While undoped material 116 and doped material 118 can function similarly, their properties can vary from one another. For example, undoped material 116 can have a lower (electrical) resistance drift coefficient (in both the amorphous phase and the polycrystalline phase) and a lower electrical resistance compared to doped material 118, which has a higher (electrical) resistance drift coefficient (in both the amorphous phase and the polycrystalline phase) and a higher electrical resistance. However, the resistance drift coefficients and electrical resistances of both undoped material 116 and doped material 118 are lower in the polycrystalline set phases than in the amorphous reset phases, respectively. Therefore, the resistance drift coefficient of doped material 118 in the set phase can be lower than the resistance drift coefficient of undoped material 116 in the reset phase. Similarly, the resistance of doped material 118 in the set phase can be lower than the resistance of undoped material 116 in the reset phase.

Figure 2:
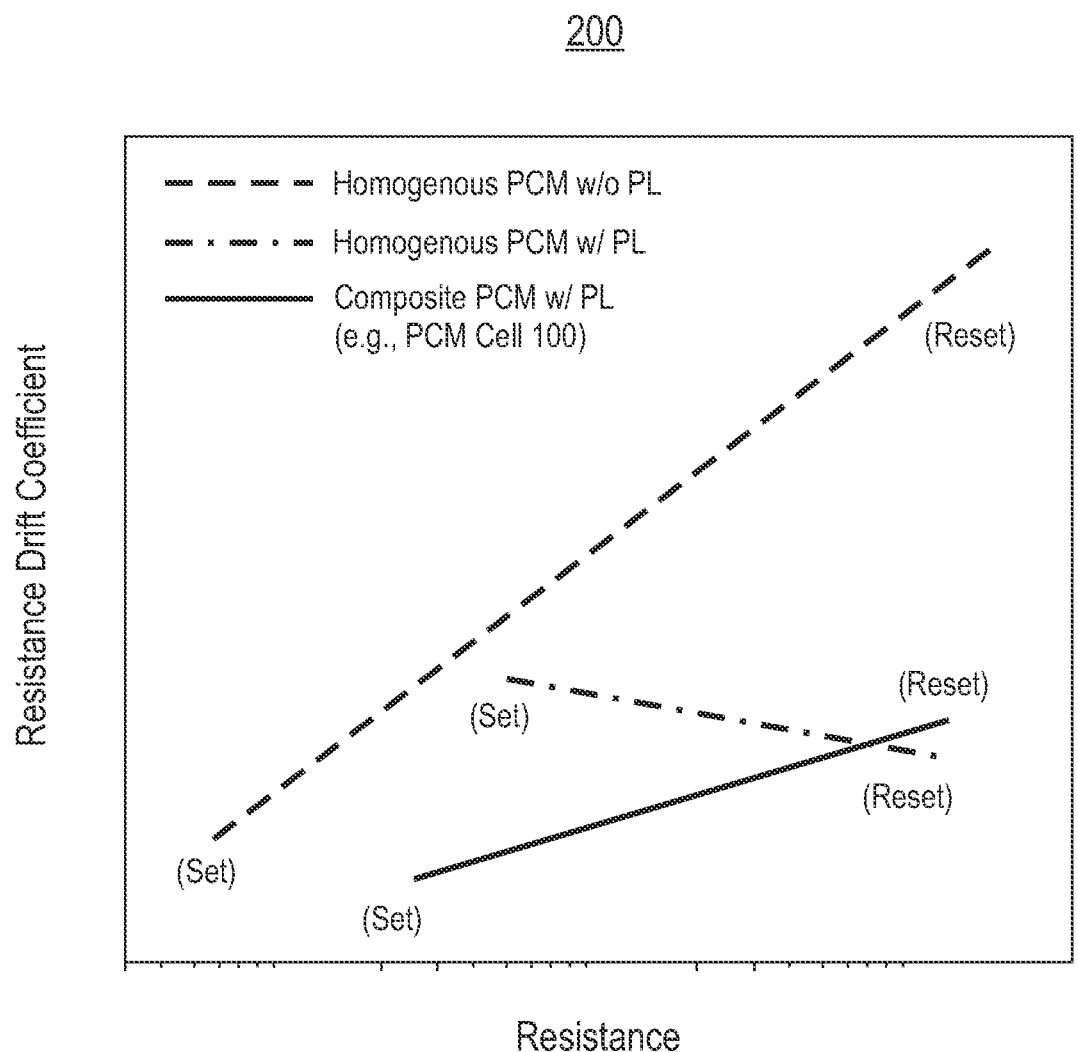
FIG. 2 is a graph of resistance drift coefficient versus logarithmic resistance between the set and reset phases for various PCM cell configurations, in accordance with embodiments of the present disclosure.

The result of these properties is shown in FIG. 2, which is graph 200 of resistance drift coefficient versus resistance between the set and reset phases for various PCM cell configurations. In the illustrated embodiment, resistance drift coefficient is displayed using a linear scale whereas resistance is displayed using a logarithmic scale. The three illustrated PCM cell configurations are homogenous PCM material without a projection liner, homogenous PCM material with a projection liner, and composite PCM section 114 with PL 112 (i.e., PCM cell 100). For each configuration, there is a line that extends from a set state (without an amorphous zone 126) to a reset state (includes a large amorphous zone 126). In the illustrated embodiment, a PCM cell with homogenous PCM material but no projection liner has low resistance and low drift in the set state, and high resistance and high drift in the reset state. A PCM cell with homogenous PCM material and a projection liner has moderate resistance and moderate drift in the set state, and high resistance and low-moderate drift in the reset state. However, PCM cell 100 has low-moderate resistance and low drift in the set state, and high resistance and low-moderate drift in the reset state. Therefore, on average, the resistance drift of PCM cell 100 is less than the other two configurations.

This phenomenon can be explained by the configuration of PCM cell 100. When all of PCM section 114 is in the polycrystalline set phase, current will primarily travel from heater 108 to top electrode 122 via undoped material 116 due to its lower resistance. Since the resistance drift coefficient of undoped material 116 in the set phase is low, the overall drift of PCM cell 100 will also be low. However, when there is a significant amorphous zone 126 (shown in FIG. 1), the current can spread out in PL 112 to avoid zone 126 due to its high resistance. Instead, the current will primarily travel to top electrode 122 via doped material 118. Although the resistance drift coefficient of doped material 118 is higher than that of undoped material 116 (in the same phases), most of doped material 118 is in the polycrystalline set phase (as opposed to the amorphous reset phase of a substantial portion of undoped material 116). Thereby, the overall drift of PCM 100 will be low-moderate. In addition, the span of resistance between the set state of PCM cell 100 and the reset state of PCM cell 100 is lengthened, which indicates a broader dynamic (i.e., usable) range of resistances. This increases the resolution of PCM cell 100.

Figure 3:
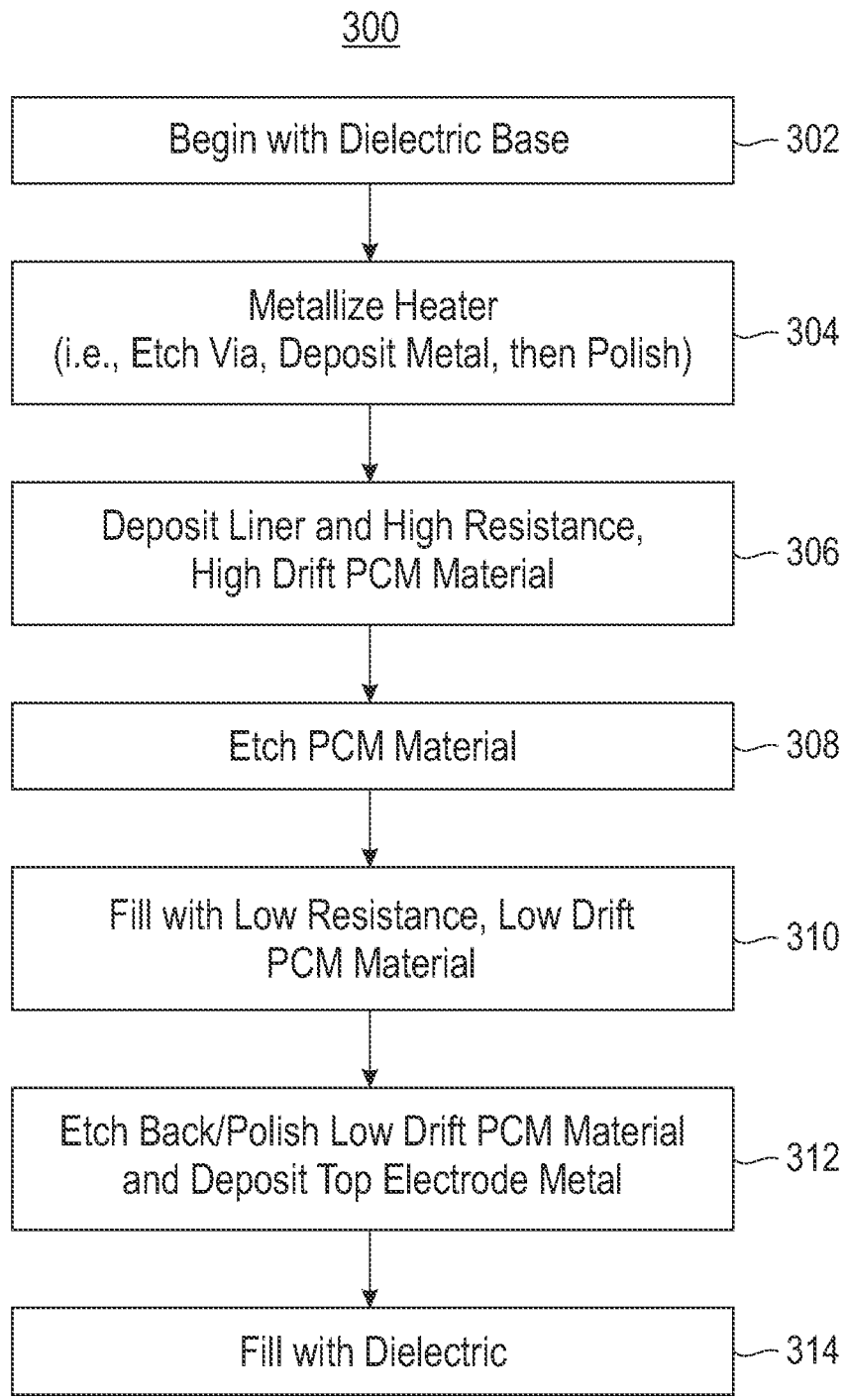
FIG. 3 is a flowchart of a method of manufacturing the PCM cell of FIG. 1A, in accordance with embodiments of the present disclosure.
Figure 4A:
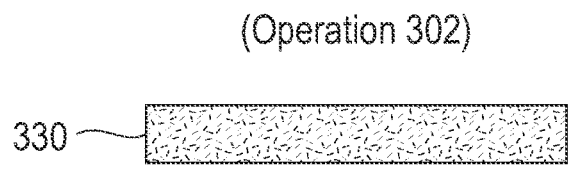
FIGS. 4A-4G are a series of cross-section views of the method of FIG. 3 of manufacturing the PCM cell, in accordance with embodiments of the present disclosure.
Figure 4B:
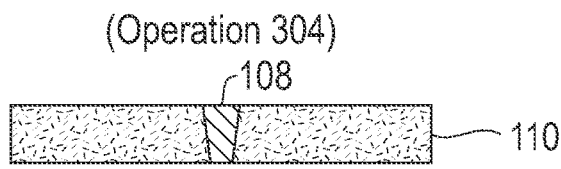
Figure 4C:
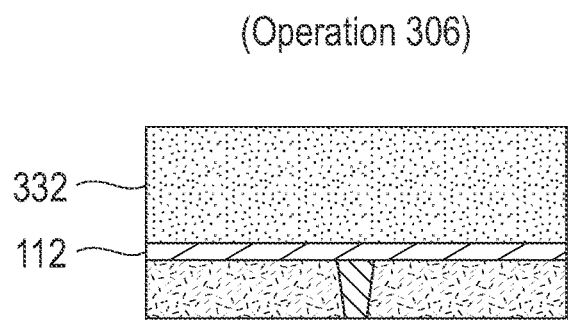
Figure 4D:
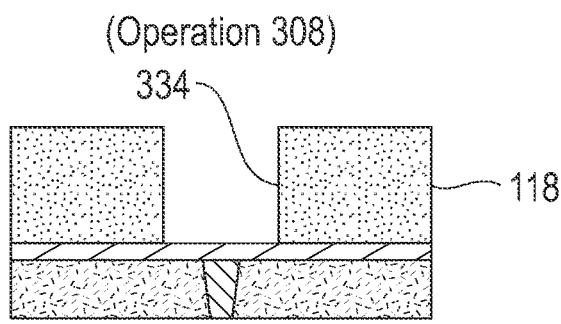
Figure 4E:
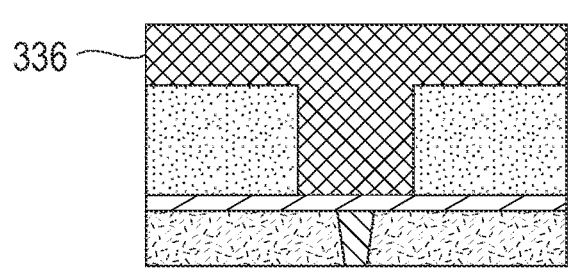
Figure 4F:
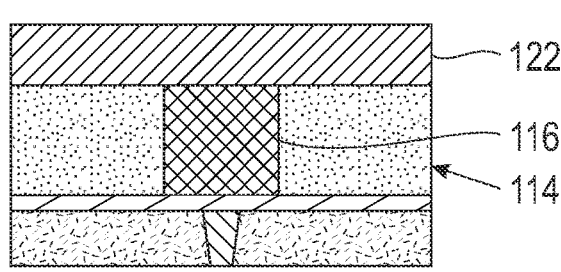
Figure 4G:
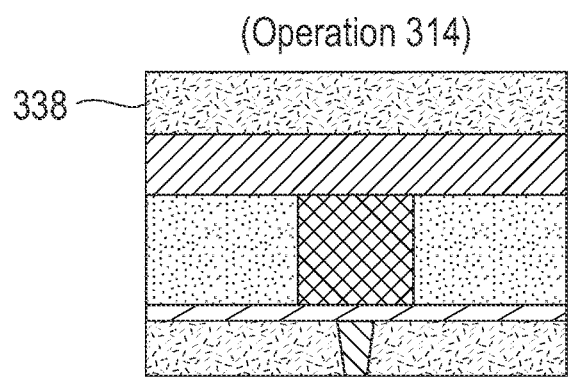

FIG. 3 is a flowchart of method 300 of manufacturing PCM cell 100. FIGS. 4A-4G are a series of cross-section views of method 300 of manufacturing the PCM cell. FIGS. 3 and 4A-4G will now be discussed in conjunction with one another wherein each operation of method 300 is illustrated by one of FIGS. 4A-4G. In addition, during this discussion, references may be made to features of PCM cell 100 shown in FIGS. 1A-2, however, some features may be omitted for the sake of simplicity (e.g., bottom wire 102, bottom electrode 104, insulator 106, and top wire 124).

In the illustrated embodiment, method 300 starts at operation 302, wherein insulating layer 330 is formed on bottom electrode 104 and insulator 106. At operation 304, a via is formed in insulating layer 330, for example, using etching to form insulator 110. Then the via is filled to form heater 108. At operation 306, PL 112 is formed on heater 108 and insulator 110, and doped layer 332 is formed on PL 112. At operation 308, via 334 is formed in doped layer 332 to expose PL 112 and form doped material 118. At operation 310, undoped layer 336 is formed on PL 112 and doped material 118. At operation 312, chemical mechanical polishing (CMP) is performed to remove the excess undoped PCM material to form undoped material 116 that is coterminous with doped material 118 (thus forming PCM section 114). Then, top electrode 122 is formed on doped material 116 and undoped material 118. At operation 314, insulating layer 338 is formed on top electrode 122.

The components, configuration, and operation of PCM cell 100 and method 300 allow for PCM section 114 to have a composite configuration that is comprised of two different PCM materials (i.e., undoped material 116 and doped material 118). Thereby, PCM section 114 includes different regions that have different material properties.

Figure 5:
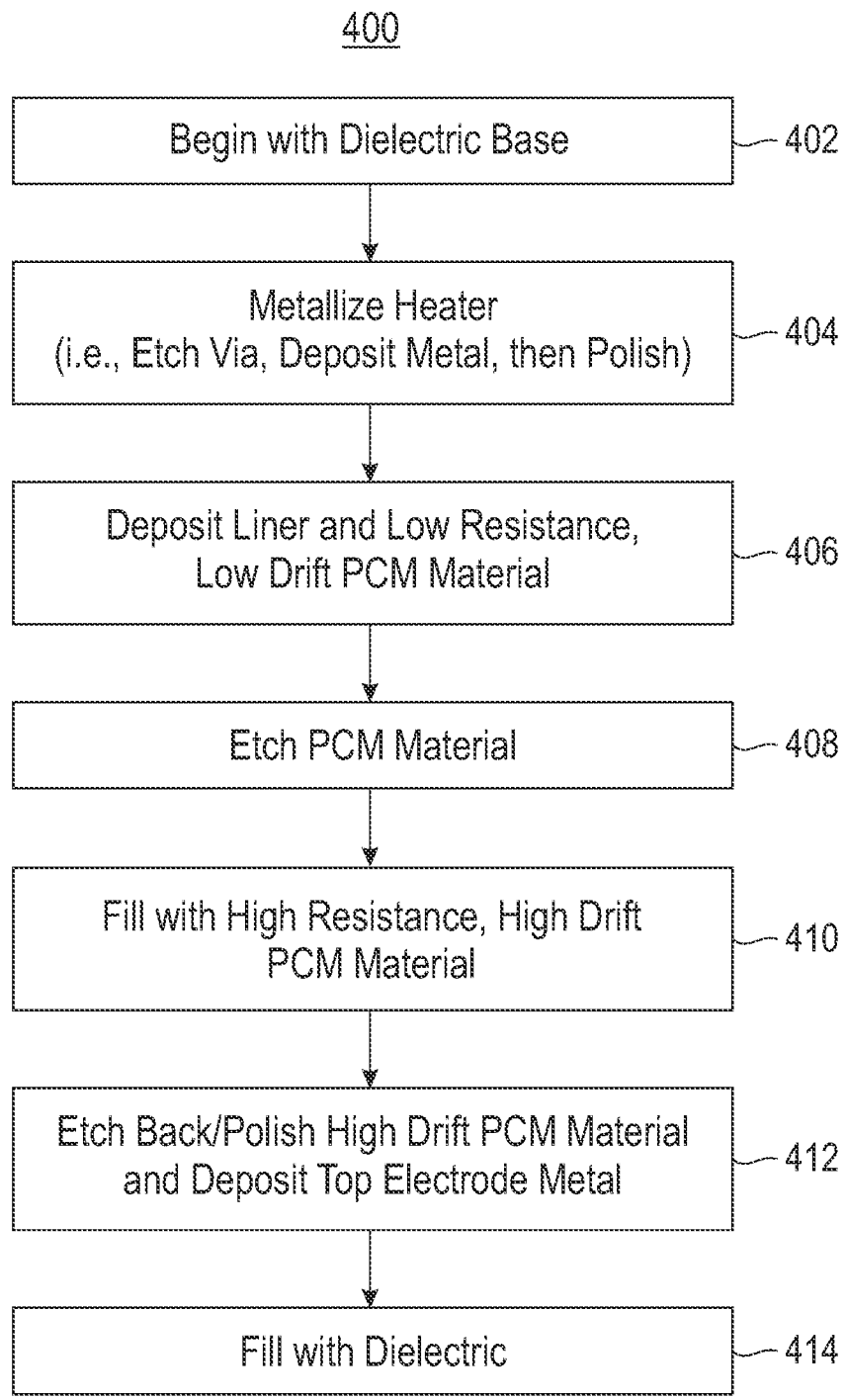
FIG. 5 is a flowchart of a method of manufacturing the PCM cell of FIG. 1A, in accordance with embodiments of the present disclosure.
Figure 6A:
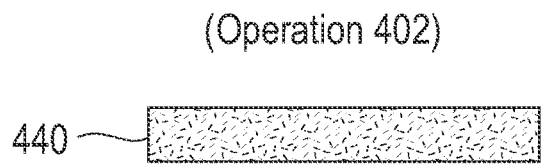
FIGS. 6A-6G are a series of cross-section views of the method of FIG. 5 of manufacturing the PCM cell, in accordance with embodiments of the present disclosure.
Figure 6B:
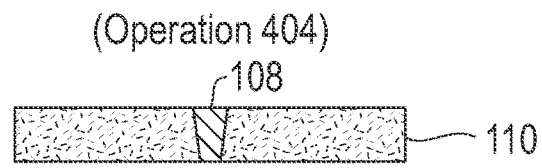
Figure 6C:
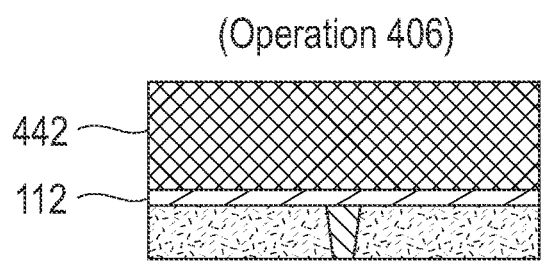
Figure 6D:
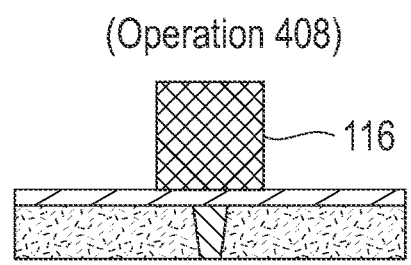
Figure 6E:
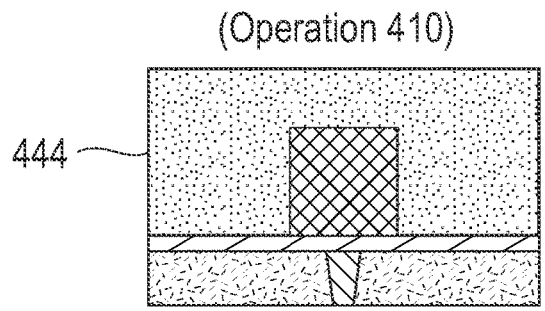
Figure 6F:
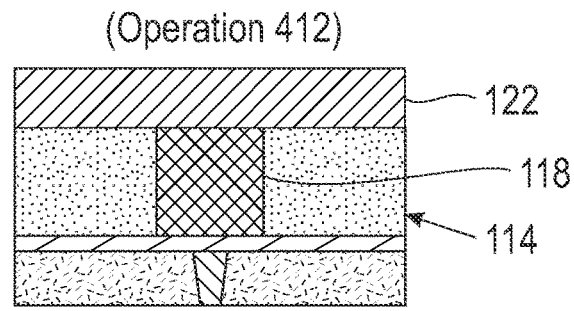
Figure 6G:
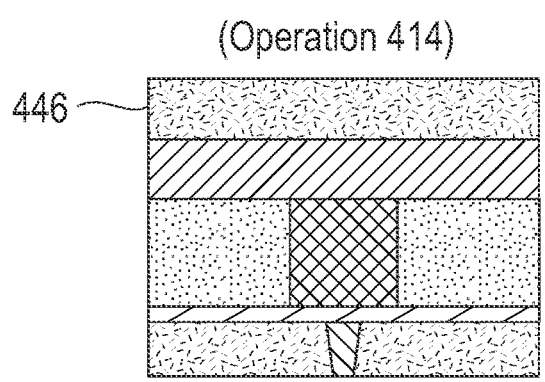
Figure 7A:
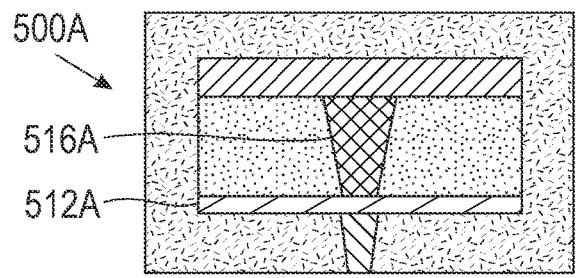
FIGS. 7A-7H are cross-section views of alternate embodiment mushroom PCM cells, in accordance with embodiments of the present disclosure.
Figure 7B:
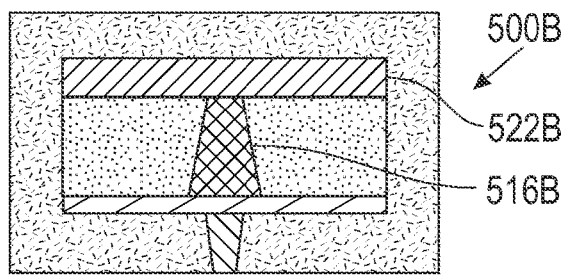
Figure 7C:
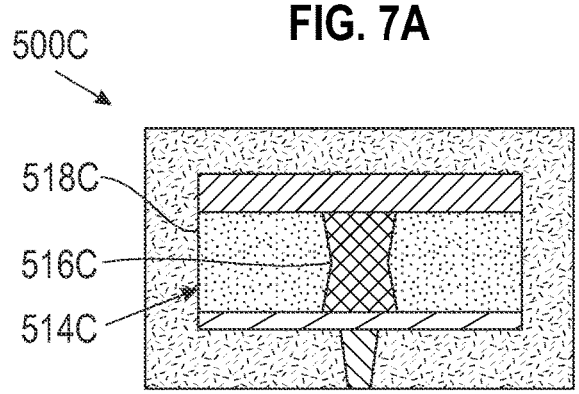
Figure 7D:
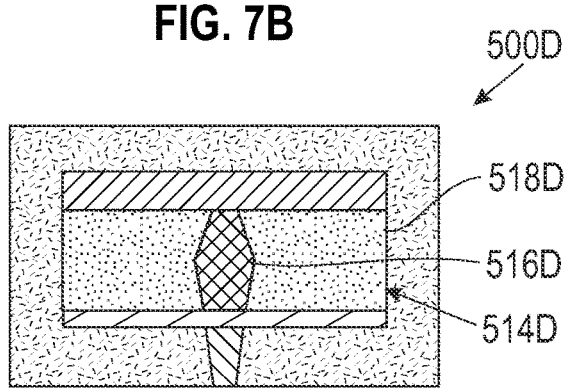
Figure 7E:
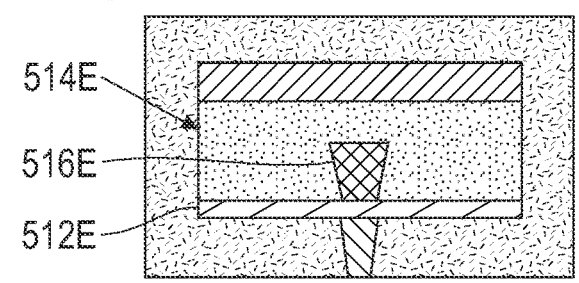
Figure 7F:
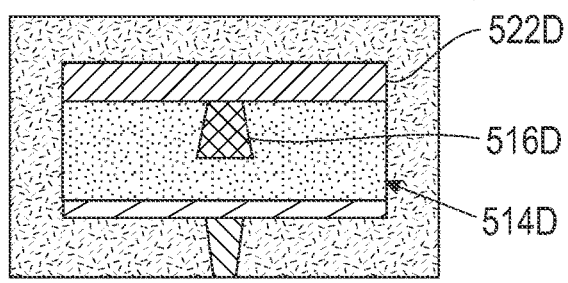
Figure 7G:
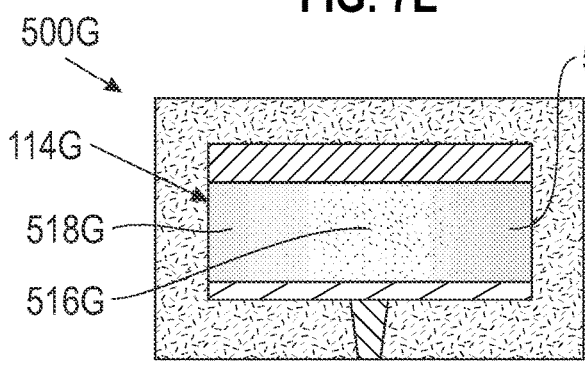
Figure 7H:
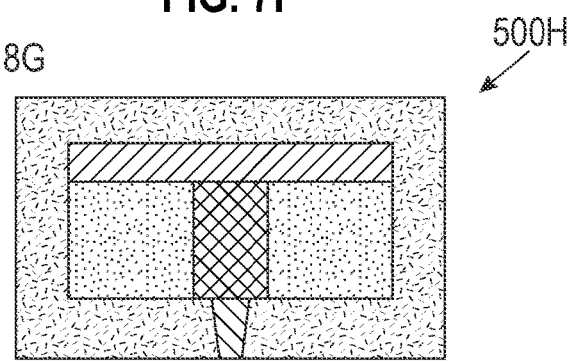

FIG. 5 is a flowchart of method 400 of manufacturing PCM cell 100. FIGS. 6A-6G are a series of cross-section views of method 400 of manufacturing the PCM cell. FIGS. 5 and 6A-6G will now be discussed in conjunction with one another wherein each operation of method 400 is illustrated by one of FIGS. 6A-6G. In addition, during this discussion, references may be made to features of PCM cell 100 shown in FIGS. 1A-2, however, some features may be omitted for the sake of simplicity (e.g., bottom wire 102, bottom electrode 104, insulator 106, and top wire 124).

In the illustrated embodiment, method 400 starts at operation 402, wherein insulating layer 440 is formed on bottom electrode 104 and insulator 106. At operation 404, a via is formed in insulating layer 438, for example, using etching to form insulator 110. Then the via is filled to form heater 108. At operation 406, PL 112 is formed on heater 108 and insulator 110, and undoped layer 442 is formed on PL 112. At operation 408, undoped material 116 is formed from undoped layer 442, which exposes PL 112. At operation 410, doped layer 444 is formed on PL 112 and undoped material 116. At operation 412, chemical mechanical polishing (CMP) is performed to remove the excess doped PCM material to form doped material 118 that is coterminous with undoped material 116 (thus forming PCM section 114). Then, top electrode 122 is formed on doped material 116 and undoped material 118. At operation 414, insulating layer 446 is formed on top electrode 122.

The components, configuration, and operation of PCM cell 100 and method 300 allow for PCM section 114 to have a composite configuration that is comprised of two different PCM materials (i.e., undoped material 116 and doped material 118). Thereby, PCM section 114 includes different regions that have different material properties.

FIGS. 7A-7H are cross-section views of alternate embodiment mushroom PCM cells 500A-500H, respectively. In the illustrated embodiment of PCM cell 500A, undoped material 516A tapers towards PL 512A. Among other methods, PCM cell 500A can be manufactured using method 300 (shown in FIG. 3).

In the illustrated embodiment of PCM cell 500B, undoped material 516B tapers towards top electrode 522B. Among other methods, PCM cell 500B can be manufactured using method 400 (shown in FIG. 5).

In the illustrated embodiment of PCM cell 500C, undoped material 516C tapers towards the middle, creating an hourglass shape. Among other methods, PCM cell 500C can be manufactured by forming the bottom and top halves of PCM section 514C separately. For example, operations 402-410, and the CMP portion of 412 can be performed to form the bottom half of PCM section 514C. Then, operations 306-314 can be performed to form the top half of PCM section 514C and complete PCM cell 500C.

In the illustrated embodiment of PCM cell 500D, undoped material 516D tapers from the middle, creating a diamond shape. Among other methods, PCM cell 500D can be manufactured by forming the bottom and top halves of PCM section 514D separately. For example, operations 302-310, and the CMP portion of 312 can be performed to form the bottom half of PCM section 514D. Then, operations 406-414 can be performed to form the top half of PCM section 514D and complete PCM cell 500D.

In the illustrated embodiment of PCM cell 500E, undoped material 516E tapers towards PL 512E and only extends halfway through PCM section 514E therefrom. Among other methods, PCM cell 500E can be manufactured by forming the bottom and top halves of PCM section 514E separately.

In the illustrated embodiment of PCM cell 500F, undoped material 516F tapers towards top electrode 522F and only extends halfway through PCM section 514F therefrom. Among other methods, PCM cell 500F can be manufactured by forming the bottom and top halves of PCM section 514F separately.

In the illustrated embodiment of PCM cell 500G, PCM section 514G has a graded transition between the centrally-located undoped material 516G and the peripherally-located, fully doped material 518G. In other words, the amount of dopant material in PCM section 514G gradually increases from the center (which has none) to the lateral exterior (which has the full concentration of dopant material). This is in contrast to the abrupt transitions between the undoped material and the doped material present in PCM cells 100, 500A-500F, and 500H-500L. In those embodiments, the amount of dopant material changes in a virtually discontinuous manner since they include composite PCM sections comprised of a portion of undoped PCM material (that is itself homogenous) in contact with a portion of fully-doped PCM material (which is itself homogenous but different from the undoped portion). Among other methods, PCM cell 500G can be manufactured by performing operations 402-406. Then, a block mask is placed over the center of undoped layer 442 (which will become undoped material 516G), and ion implant of dopant is performed (creating doped material 518G). In some embodiments, undoped material 516G is actually not doped, and in some embodiments, undoped material 516G is less doped than doped material 518G.

In the illustrated embodiment of PCM cell 500H, PCM cell 500H is similar to PCM cell 100 (shown in FIG. 1A). However, PCM cell 500H lacks a projection liner.

FIGS. 8A and 8B are cross-section views of alternate embodiment confined PCM cells 500I and 500J, respectively. In the illustrated embodiment of PCM cell 500I, PCM cell 500I includes bottom electrode 504I, PL 512I, PCM section 514I (which includes undoped material 516I and doped material 518I), and top electrode 522I. While PCM cell 500I has a confined cell configuration, it still has doped material 518I surrounding undoped material 516I such that doped material 518I is offset from axis 528I in a lateral direction (i.e., perpendicular to axis 528I).

In the illustrated embodiment of PCM cell 500J, PCM cell 500J is similar to PCM cell 500I. However, undoped material 516J is in direct contact with PL 512J instead of having doped material 518J therebetween.

FIG. 9 is a cross-section view of alternate embodiment pillar PCM cell 500K. In the illustrated embodiment of PCM cell 500K, PCM cell 500K includes bottom electrode 504K, PL 512K, PCM section 514K (which includes undoped material 516K and doped material 518K), and top electrode 522K. While PCM cell 500K has a pillar cell configuration, it still has doped material 518K surrounding undoped material 516K such that doped material 518K is offset from axis 528K in a lateral direction (i.e., perpendicular to axis 528K).

FIG. 10A is a cross-section view of an alternate embodiment bridge PCM cell 500L, and FIG. 10B is a top view of bridge PCM cell 500L. In the illustrated embodiment of PCM cell 500L, PCM cell 500L includes first electrode 504L, PL 512L, PCM section 514L (which includes undoped material 516L and doped material 518L), and second electrode 522L. PCM cell 500K has a bridge cell configuration such that first electrode 504L is coplanar with second electrode 522L. Thereby, PL 512L and PM section 514L extend parallel to axis 528L (which extends between electrodes 504L and 522L), instead of being centered on axis 528L. During operation of PCM cell 500L, current flows perpendicular to axis 528L proximate to the wide electrodes 504L and 522L. However, as the current crosses the narrow bridge 548L, axis 528L is still parallel to the direction of current flow. Because the active portion of PM section 514L (i.e., the portion where amorphous zone 126 would be created and eliminated) is located in bridge 548L, PCM cell 500L still has doped material 518L surrounding undoped material 516L such that doped material 518L is offset from the flow of current in a lateral direction (i.e., perpendicular to axis 528L).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory (PCM) cell comprising:
   a first electrode comprised of a first electrically conductive material;
   a second electrode comprised of a second electrically conductive material; and
   a phase change section positioned between the first electrode and the second electrode, the phase change section comprising:
     a first phase change material having a first resistance drift coefficient; and
     a second phase change material having a second resistance drift coefficient that is greater than the first resistance drift coefficient,
   wherein an axis of the PCM cell extends between the first electrode and the second electrode, and
   wherein the second phase change material is offset from the first phase change material in a direction that is perpendicular to the axis.

2. The PCM cell of claim 1, wherein the phase change section has a graded transition between the first phase change material and the second phase change material.

3. The PCM cell of claim 1, wherein the phase change section has an abrupt transition between the first phase change material and the second phase change material.

4. The PCM cell of claim 1, wherein the first phase change material is undoped and the second phase change material is doped.

5. The PCM cell of claim 1, further comprising: a projection liner between the first electrode and the phase change section, wherein the projection liner is comprised of a material with a resistivity between a resistivity of a polycrystalline phase of the first phase change material and a resistivity of an amorphous phase of the first phase change material.

6. The PCM cell of claim 1, further comprising; a heater positioned between the first electrode and the phase change section.

7. The PCM cell of claim 6, wherein,
   the heater has a first width,
   the phase change section has a second width, and
   the second width is greater than or equal to thrice the first width.

8. The PCM cell of claim 6, further comprising: a projection liner between the heater and the phase change section, wherein the projection liner is comprised of a material with a resistivity between a resistivity of a polycrystalline phase of the first phase change material and a resistivity of an amorphous phase of the first phase change material.

9. A method of manufacturing a phase change memory (PCM) cell, the method comprising:
   forming a first electrode;
   forming a phase change section electrically connected to the first electrode, wherein the phase change section comprises:
     a first phase change material having a first resistance drift coefficient; and
     a second phase change material having a second resistance drift coefficient that is greater than the first resistance drift coefficient; and
   forming a second electrode on the phase change section,
   wherein an axis of the PCM cell extends between the first electrode and the second electrode, and
   wherein the second phase change material is offset from the first phase change material in a direction that is perpendicular to the axis.

10. The method of claim 9, further comprising; forming a projection liner between the first electrode and the phase change section.

11. The method of claim 9, further comprising; forming a heater between the first electrode and the phase change section.

12. The method of claim 11, wherein
    the heater has a first width,
    the phase change section has a second width, and
    the second width is greater than or equal to thrice the first width.

13. The method of claim 9, wherein forming the phase change section comprises:
    depositing the second phase change material;
    etching the second phase change material to form a via; and
    filling the via with the first phase change material.

14. The method of claim 9, wherein forming the phase change section comprises:
    depositing the first phase change material;
    etching the first phase change material to form a pillar; and
    surrounding the pillar with the second phase change material.

15. The method of claim 9, wherein forming the phase change section comprises; grading the phase change section to transition from the first phase change material to the second phase change material.

16. The method of claim 9, wherein the first phase change material is undoped and the second phase change material is doped.

17. A phase change memory (PCM) cell comprising:
    a first electrode comprised of a first electrically conductive material;

a second electrode comprised of a second electrically conductive material;

a phase change section positioned between the first electrode and the second electrode, the phase change section comprising:
  a first phase change material having a first resistivity; and
  a second phase change material having a second resistivity that is greater than the first resistivity; and a projection liner between the first electrode and the phase change section, wherein the projection liner is comprised of a material with a resistivity between a resistivity of a polycrystalline phase of the first phase change material and a resistivity of an amorphous phase of the first phase change material, wherein an axis of the PCM cell extends between the first electrode and the second electrode, and wherein the second phase change material is offset from the first phase change material in a direction that is perpendicular to the axis.

18. The PCM cell of claim 17, wherein:

the first phase change material has a first resistance drift coefficient; and a second phase change material having a second resistance drift coefficient that is greater than the first resistance drift coefficient.

19. The PCM cell of claim 17, further comprising a heater positioned between the first electrode and the phase change section.

* * * * *